United States Patent [19]

Krause et al.

[11] 4,240,087

[45] Dec. 16, 1980

[54] SCREENING ELECTRODES FOR OPTICAL SEMICONDUCTOR COMPONENTS

[75] Inventors: Gerhard Krause, Rosenheim; Werner Spaeth, Holzkirchen, both of Fed. Rep. of Germany

[73] Assignee: Siemens Aktiengesellschaft, Berlin & Munich, Fed. Rep. of Germany

[21] Appl. No.: 956,906

[22] Filed: Nov. 2, 1978

Related U.S. Application Data

[63] Continuation of Ser. No. 745,356, Nov. 26, 1976.

[30] Foreign Application Priority Data

Dec. 4, 1975 [DE] Fed. Rep. of Germany ....... 2554626

[51] Int. Cl.³ .................................................. H01L 21/12
[52] U.S. Cl. ........................................... 357/19; 357/53
[58] Field of Search .......................... 357/30, 53, 19, 17

[56] References Cited

U.S. PATENT DOCUMENTS

| | | | |
|---|---|---|---|
| 3,290,175 | 12/1966 | Cusano | 136/89 |
| 3,405,329 | 10/1968 | Loro | 317/234 |
| 3,436,548 | 4/1969 | Biard | 250/211 |
| 3,543,302 | 1/1970 | Kazan | 250/213 |
| 3,559,003 | 1/1971 | Beaudouin | 317/234 |
| 3,602,782 | 8/1971 | Klein | 317/235 R |
| 3,789,216 | 1/1974 | Komp | 250/211 R |

*Primary Examiner*—Martin H. Edlow
*Attorney, Agent, or Firm*—Hill, Van Santen, Steadman, Chiara & Simpson

[57] ABSTRACT

An optoelectronic coupler with a semiconductor transmitter and a semiconductor receiver has a transparent conductive screen formed of semiconductor material overlying the active area of at least one of the transmitter and receiver, in the path of optical radiation passing between the transmitter and receiver, and directly electrically connected to a semiconductor zone of the active area, to protect the coupler from changes in its electrical characteristics due to high intensity electric fields.

12 Claims, 3 Drawing Figures

SCREENING ELECTRODES FOR OPTICAL SEMICONDUCTOR COMPONENTS

This is a continuation of application Ser. No. 745,356, filed Nov. 26, 1976.

BACKGROUND OF THE INVENTION

When optical transmitters and receivers are coupled by means of light-transmissive insulating materials, and when high electric fields prevail between transmitter and receiver, changes occur in the electrical characteristic values of the system components, in particular, in the values of the receiver. The influence of such electric field gives rise to partially irreversible effects generally in the receiver, for example, an increase in the reverse current, a reduction in the current amplification, and a change in the operating point. A considerable change in the electric characteristic values generally gives rise to a serious impairment of the effects of the associated semiconductor component.

BRIEF SUMMARY

The present invention, more particularly, provides screening electrodes for optical semiconductor components and to the systems equipped with such screening electrodes. The invention further teaches various illustrative applications and techniques for using the screening electrodes provided herein, and provides processes for making such.

A primary object of the present invention is, to provide screening electrodes, which are particularly well adapted for optical semiconductor components, and which prevent the influence of electric fields and the associated occurrence of changes in the electrical characteristic values in such semiconductor components.

This object is realized in accordance with the present invention by the provision of screening electrodes which are transmissive to optical radiation and which are arrangeable on the relevant or desired semiconductor component.

Other and further objects, aims, purposes, advantages, features and the like will be apparent to those skilled in the art from the teachings of the present application taken with the accompanying drawings.

DETAILED DESCRIPTION

Figure 1:
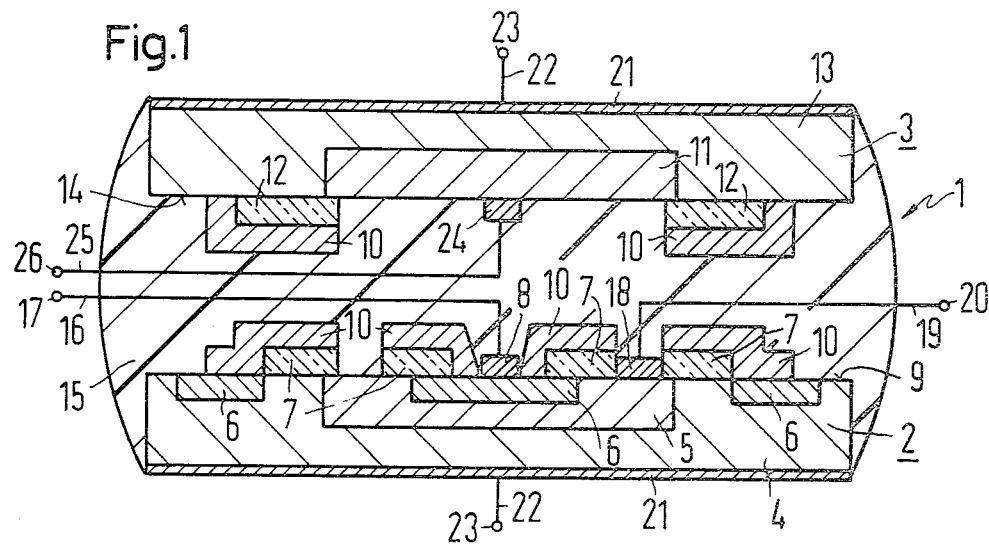
FIG. 1 is a cross-sectional view through an optoelectronic coupler which is provided with screening electrodes in accordance with the invention and wherein the receiver is a photo-transistor.

It is advantageous for screening electrodes of this invention to be transmissive of optical radiation in the spectral range between about 200 to 1100 nm.

Semiconducting substances utilized as electrically conductive materials may comprise screening electrodes of this invention. The use of semiconducting material in these screening electrodes has specific advantages in comparison to, for example, a corresponding use of metals. Metallic screening electrodes for optical semiconductor components must, if considerable absorption losses are not to occur, possess an extremely thin layer thickness. Such thin metallic screening electrodes have on the other hand only a slight mechanical and chemical stability. When semiconducting materials are used for screening electrodes, however, it is found possible to use screening materials exhibiting sufficiently low absorption characteristics over the entire spectral operative range of a given optical semiconductor component. Thus, the layer thickness of a given screening electrode can be made sufficient to ensure its mechanical and chemical stability.

In addition, it is advantageous for such particular semiconducting materials as are used in screening electrodes in accord with this invention to comprise semiconductor compounds. Preferred semiconductor compounds are represented by the following generic formulas:

$$A_IB^{VII}, A_{II}B^{VI}, A_{III}B^V, A_{IV}B^{IV}, A_VB^{III}, A_{VI}B^{II},$$
and $A_{VII}B^I$ wherein A represents a cationic element, B represents an anionic element, and the Roman numerals indicate the Group in the Periodic Table of the Elements from which a particular A or B is selected. A given screening element can be comprised of one or more of such individual semiconductor compounds.

It is particularly advantageous for a screening electrode of this invention to comprise a polycrystalline semiconductor layer, and, in particular, to consist of polycrystalline silicon.

The use of a polycrystalline semiconductor layer as a screening electrode is particularly advantageous because the application of such a layer has already been technically mastered. Also, a polycrystalline silicon layer can be produced which has a high specific resistance so that application of a screening electrode comprised of such a layer does not reduce the quality of an associated semiconductor component.

For some specific fields of use in accord with the teachings of this invention, it is also advantageous for the semiconducting material of a screening electrode to be a semiconducting glass.

A further development of the invention concerns the use of mixtures of non-conductors and conductors, in example, a mixture of $SiO_2$ and chromium used as an electrically conductive composition to make a screening electrode.

A further development of the invention concerns the use of screening electrodes in this invention incorporated into the transmitter and/or receiver ends of optoelectric couplers.

In optoelectronic couplers, it is a definite advantage to protect the receiver by means of screening electrodes of this invention from the effects of strong electric fields and thus to ensure optimum receiver operating efficiency. There are, however, situations where it can be advantageous to equip not only the receiver, but also a semiconducting transmitter with screening electrodes of this invention.

It is also advantageous to have, as in the case of optoelectric couplers, receiver-end photo-transistors, or amplifier transistors, provided with screening electrodes of this invention in such a manner that one screening electrode overlies a collector-base-pn junction which is covered with an insulating layer, and a second screening electrode overlies an associated transistor zone base-emitter-pn junction which also is covered with an insulating layer. The interrelationship is such that, at the maximum, one of the transistor zones is, in each instance, electrically conductively connected to an associated screening electrode. When a photo-transistor is used as an optical receiver, for reasons of economy, it is particularly advantageous to connect such an associated screening electrode to each respective transistor zone. A contacting of a screening electrode with each electric terminal being led out of a semiconductor component individually is also technically practical, but is generally uneconomical.

A further development of the invention concerns selecting the optical layer thickness of a given screening electrode of this invention so as to minimize any reflection on such screening electrode. This measure results in an optimization of the optical power input-coupled into an associated receiver in an optoelectric coupler.

A further development of the invention concerns making the electric ohmic resistance of a given screening electrode of this invention be sufficiently high enough to cause the product of the resistance and the capacitance of such screening electrode, relative to an underlying semiconductor layer, which carries a different potential compared to such screening electrode, be such as to produce a time constant which is greater than the shortest signal rise time and signal fall time for which the semiconductor component bearing such screening electrode is designed. This measure prevents the presence of a screening electrode from causing an increase in the signal rise, and signal fall time of the associated semiconductor component. Such means simultaneously prevents an impairment of such a semiconductor component caused by the application of a screening electrode thereto.

An advantageous application of screening electrodes to semiconductor components is effected by this invention in that such an application can be accomplished by vapor deposition. Vapor deposition is particularly well suited for the application of polycrystalline silicon. Such an application method is simple to handle technically, and also involves lower production costs.

Depending upon the special requirements that may exist in any given situation, it can be advantageous to apply screening electrodes of this invention to semiconductor components in such a manner that application takes place (a) by deposition from a gas phase (b) from a molecular beam, or (c) by sputtering of at least one screening electrode component.

For example, screening electrodes each consisting of silicon can be deposited by thermal decomposition of $SiH_4$ or $SiH_2Cl_2$ in inert gas.

Furthermore, screening electrodes in accordance with the invention can be produced by sputtering or simultaneous vapor deposition with a non-conductive component and a conductive component. For example, silicon dioxide can be used as the non-conductive component, and chromium or copper can be used as the conductive component. Screening electrodes in accordance with the invention can also be deposited by simultaneous vapor deposition from two different sources, such as, for examples, from a $SiO_2$ source, and from a chromium source.

It is also advantageous for screening electrodes to be applied to semiconductor components by sedimentation from liquid suspension or solution with suitable materials.

Referring to FIG. 1, there is seen an optoelectronic coupler 1 which is comprised of an optical transmitter 3 and an optical receiver 2. The optical receiver 2 consists here of a photo-transistor with a semiconductor body 4 which is, for example; n—doped. A central p—conducting zone 5 is doped into the n—conducting semiconductor body 4 from the direction of the surface 9. Also from the direction of the surface 9 of the semiconductor body 4, n+conducting zones 6 are diffused both into n—conducting zones of the semiconductor body 4 and also into the central p—conducting zone 5. Layers 7 on the semiconductor surface 9 are here silicon dioxide layers. A layer 8 provides a metallic contact for the n+doped central zone 6, which layer 8 is provided with a line 16 which leads out to a terminal 17.

A contact 18 is arranged on the p—conducting zone 5 of the optical receiver 2, and a line 19 leads out from contact 18 to a terminal 20. Finally, the semiconductor body 4 of the optical receiver 2 is connected through a layer 21 by means of a line 22 to a terminal 23.

The layers 10 are screening electrodes in accordance with the present invention. The optical transmitter 3 consists of a luminescent diode with an n—conducting semiconductor body 13 into which a p—conducting central zone 11 is diffused at a surface 14. The semiconductor body 13 is contacted by an electrode 21 (like the semiconductor body 4). The electrode 21 is connected via a line 22 to a terminal 23. The layers 12 on the surface 14 consist of silicon dioxide. The layers 12 are overlaid with layers 10 which are screening electrodes of the present invention. For contacting the p—conducting zone 11, a contact component 24 is arranged on the surface 14 of the optical transmitter 3, a line 25 leads from the component 24 to a terminal 26. The luminescent diode 2 and the photo-transistor 3 are coupled together by a substantially transparent synthetic sealing compound 15.

Figure 2:
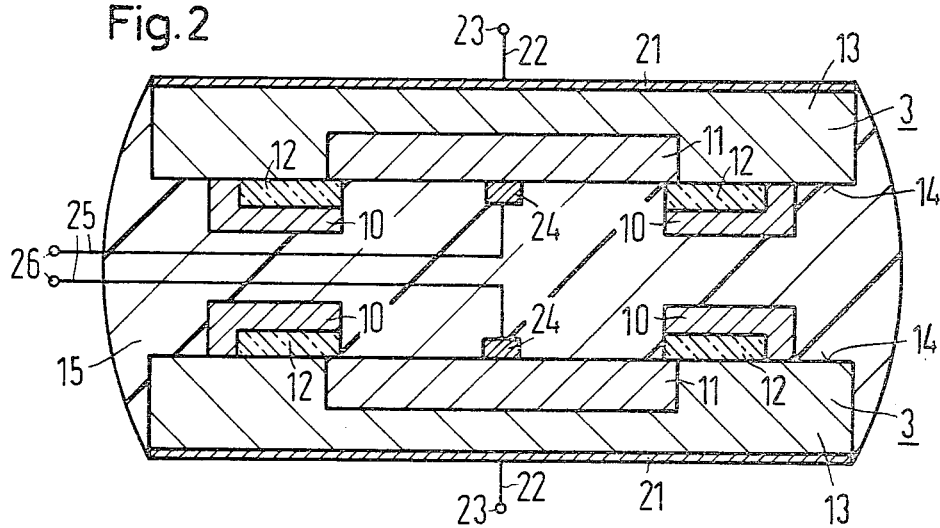
FIG. 2 is a cross-sectional view through an optoelectronic coupler which is provided with screening electrodes in accordance with the invention, in which transmitter and receiver are in the form of diodes.

FIG. 2 differs from FIG. 1 only inasmuch as the optical transmitter 3 and the optical receiver 2 are in the form of diodes. The diode which represents the receiver is therefore indicated by the reference numeral 3. A description of the individual parts is consequently provided by the description of FIG. 1 for the correspondingly designated component elements.

Figure 3:
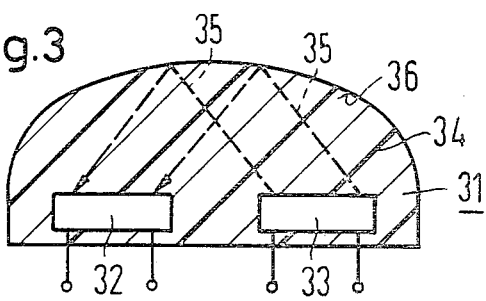
FIG. 3 is a cross-sectional view through a schematically illustrated optoelectronic coupler wherein the transmitter and the receiver are arranged next to one another, and wherein the screening electrodes are comprised of a synthetic compound.

FIG. 3 represents an optoelectronic coupler 31 with an optical transmitter 33 and an optical receiver 32 which are arranged next to one another, and which are optically interconnected together by a substantially transparent synthetic sealing compound 34. The synthetic mass 34 is so shaped that light beams 35 which are emitted from the optical transmitter 33 reach the optical receiver 32 with the lowest possible losses while simultaneously exploiting as far as possible total reflection on the surface 36 of the sealing compound 34.

For the production of optoelectronic couplers, screening electrodes are arranged at the receiver end, and optionally also at the transmitter end, as illustrated in the Figures. For reasons of economy, it is expedient to connect each screening electrode to a maximum of one transistor zone. However, it is also possible, although economically less sensible, to provide electric terminals on each individual screening electrode and to lead each of these out of a semiconductor device in insulated fashion.

The materials employed for each screening electrode must characteristically exhibit a specific electric conductivity for optimum results as those skilled in the art will appreciate. Due to the necessity that screening electrodes should be permeable to optical radiation, the use of metals as screening electrode material for optical semiconductors requires extremely thin layer thicknesses as indicated above. These small layer thicknesses result in a low mechanical and chemical stability of such screening electrodes.

When a semiconducting material is used as a screening electrode material, polycrystalline silicon is particularly preferred. As a screening electrode material, polycrystalline silicon exhibits both an adequate conductivity to screen electric interference fields from the associated semiconductor component, and also a sufficiently high resistance to ensure that the provision of such a screening electrode does not increase the signal rise, and signal fall, times of an associated semiconductor component, for which reason the efficiency of a semiconductor component is not impaired by the provision of such a screening electrode therefor.

By way of further screening electrode materials, compound semiconductors, in particular compound semiconductors of the type $_AI_BVII$, $_AII_BVI$, $_AIII_BV$, $_AIV_BIV$, $_AV_BIII$, $_AVI_BII$, and $_AVII_BI$ and mixtures thereof, may be employed as above indicated. The following semiconductor compounds are presently preferred: copper iodide (CuI), copper oxide ($Cu_2O$), nickel oxide (NiO), cobalt oxide (CoO), uranium dioxide ($UO_2$), lead sulphide ($P_bS$), lead selenide (PbSe), zinc oxide (ZnO), titanium dioxide ($TiO_2$), tungsten trioxide ($WO_3$), iron oxide ($Fe_2O_3$), silicon carbide (SiC), gallium aluminum arsenide (GaAlAs), gallium indium arsenide (GaInAs), zinc sulphide (ZnS), cadmium sulphide (CdS), lead sulphite (PbS), and the like.

Semiconducting glasses may also be employed as screening electrode material.

Screening electrode materials can also comprise mixtures of non-conductors and conductors, for example, mixtures of $SiO_2$ and metals, such as chromium, copper silver, gold, and the like.

It should be noted that screening electrodes of this invention do not have to be permanently arranged on the oxide layers which are themselves permanently deposited on a semiconductor surface. Thus, it is, for example, quite possible to arrange screening electrodes of this invention at a specific distance from such semiconductor surface and oxide layers.

The example illustrated in FIG. 1 is a particularly suitable one for illustrating the elimination of the field effect in opto-couplers. Thus, here, the optical transmitter is comprised of a luminescent diode and the optical receiver is comprised of a photo-transistor. Transmitter and receiver are coupled by a synthetic sealing compound which, as is illustrated in FIG. 1, is located between transmitter and receiver. In order to avoid the field effect, screening electrodes which screen (effectively prevent) the penetration of an outside electric field into the photo-transistor are arranged on the oxide frame of the collector-base-diode and of the base-emitter diode. This screening serves to avoid a change in the characteristic electrical values of the photo-transistor. Therefore, in spite of the existence of outer electric fields, the operating mode and efficiency of the phototransistor remain unchanged.

If desirable, it is also possible to arrange screening electrodes as is illustrated in the Figures, at the transmitting end of an opto-coupler. However, the provision of transmitter-end screening electrodes is not necessary in all use situations, as those skilled in the art will readily appreciate.

The use of screening electrodes of the type provided by the present invention is not restricted to the indicated illustrative application of electro-optical couplers. Screening electrodes in accordance with the invention can, in fact, be used, for any optical semiconductor component which is to be screened from the influence of outer electric fields.

Other and further embodiments and variations of the present invention will become apparent to those skilled in the art from a reading of the present specification taken together with the drawings and no undue limitations are to be inferred or implied from the present disclosure.

The claims are:

1. In an optoelectronic coupler having a semiconducting optical transmitter with a p-n junction, a semiconducting optical receiver with a p-n junction, and a transparent sealing compound interposed therebetween, the improvement comprising an insulating layer overlying a portion of at least one of the two semiconductor zones forming one of said p-n junctions, said insulating layer being disposed in the path of optical radiation passing from said transmitter to said receiver and a transparent, electrically conductive screen layer overlying said insulating layer, said screen layer being electrically connected to one of said two semiconductor zones.

2. An article according to claim 1, wherein said screen layer is formed with material having a relatively high resistance.

3. An article according to claim 1, wherein said screen layer is transparent to radiation having a wavelength between 400 and 1100 nm.

4. The article according to claim 1, wherein said screen layer is formed with semiconductive material.

5. The article according to claim 4, wherein said screen layer consists of a polycrystalline semiconductor layer.

6. The article according to claim 5, wherein said polycrystalline semiconductor comprises polycrystalline silicon.

7. The article according to claim 4, wherein said screen layer comprises semiconducting glass.

8. The article according to claim 1, wherein the thickness of said screen layer is selected to minimize reflection by said screen electrode.

9. The article according to claim 1, wherein said insulating layer and said screen layer both overlie said one p-n junction.

10. The article according to claim 1, wherein said semiconducting receiver is a photo-sensitive transistor having two p-n junctions in the path of optical radiation passing from said transmitter to said receiver, and including insulating layers overlying both of said junctions, and two transparent, electrically conductive screen layers individually overlying both of said junctions, said two screen electrodes each being individually connected to one side of the p-n junction which it overlies.

11. The article according to claim 1, including an insulating layer and a screen layer overlying each of the p-n junctions of said transmitter and said receiver.

12. The article according to claim 1, wherein said screen layer is disposed entirely within the space separating said transmitter and said receiver.

* * * * *